United States Patent [19]

Beisswenger et al.

[11] Patent Number: 4,467,205
[45] Date of Patent: Aug. 21, 1984

[54] HIGHLY-STEADY BEAM GENERATING FOR CHARGED PARTICLES

[75] Inventors: Siegfried Beisswenger; Wolfgang Boppel, both of Preetz, Fed. Rep. of Germany

[73] Assignee: Dr. Ing. Rudolf Hill GmbH, Fed. Rep. of Germany

[21] Appl. No.: 425,311

[22] Filed: Sep. 28, 1982

[30] Foreign Application Priority Data

Oct. 21, 1981 [EP] European Pat. Off. .......... 81 108624

[51] Int. Cl.³ .......................... G01K 1/00; H01J 3/00
[52] U.S. Cl. ............................. 250/397; 250/396 R; 250/505.1; 313/363.1
[58] Field of Search ............ 250/396, 397, 283, 505.1; 219/121 EP; 313/361.1, 363.1

[56] References Cited

U.S. PATENT DOCUMENTS

| | | | |
|---|---|---|---|
| 3,887,784 | 6/1975 | Alois et al. | 219/121 EP |
| 3,903,392 | 9/1975 | Konig et al. | 219/121 EP |
| 3,937,966 | 2/1976 | Godel et al. | 250/283 |
| 4,058,730 | 11/1977 | Mayer et al. | 250/397 |
| 4,260,897 | 4/1981 | Bakker et al. | 250/397 |
| 4,309,589 | 1/1982 | Hashimoto et al. | 250/397 |

Primary Examiner—Bruce C. Anderson
Attorney, Agent, or Firm—Hill, Van Santen, Steadman & Simpson

[57] ABSTRACT

An electron beam generating system provides a high degree of steadiness of the beam current and comprises a heated cathode, an auxiliary electrode lying at a more negative potential than the cathode, and a transpierced anode. A diaphragm surrounding the beam and connected to a precision resistor is further provided at that side of the auxiliary electrode facing away from the cathode. A portion of the beam current influenced by the control electrode is blanked out by the diaphragm. The precision resistor is connected as an actual value generator to a regulator which is connected to a reference voltage, the output of the regulator influencing the potential of the control electrode over a final control element for the purpose of maintaining the beam current measured by the diaphragm constant.

5 Claims, 2 Drawing Figures

HIGHLY-STEADY BEAM GENERATING FOR CHARGED PARTICLES

BACKGROUND OF THE INVENTION

1. Field of the Invention

The present invention relates to a highly-steady beam generator for charged particles having a heated cathode, an auxiliary electrode and a transpierced anode.

2. Description of the Prior Art

Electron beam generating systems are already known in the art in which the beam current is controllable by an auxiliary electrode, also referred to as a Wehnelt cylinder. For various applications, for example, for material processing or electron beam microscopy or electron beam lithography, a high degree of steadiness of the electron beam is required which, however, has not yet been achieved to its full extent in practice. For example, an electron beam generating system having a heated cathode, a transpierced anode and an auxiliary anode lying at a more negative potential than the cathode has been proposed in the patent application PCT/DE/80/00086, fully incorporated herein by this reference, which is characterized in that the beam current is determined by dimensioning the active surface of the cathode and by controlling the cathode heating to a constant temperature. It is thereby achieved that the emission current is kept constant. However, the aperture angle of the beam cone changes due to thermal drifts which particularly occur in the start-up phase of operation since, when heating up the system, the spacing of the cathode to the anode is changed, whereby the shape of the electrical acceleration field is also changed. The changes are of such size that they have a disruptive effect.

SUMMARY OF THE INVENTION

It is therefore the object of the present invention to provide a highly-steady beam generator given which a beam is available which is constant in terms of source size, aperture cone and beam current.

The above object is achieved in that an aperture restrictor surrounding the beam and connected to a precision resistor is provided at that side of the auxiliary electrode facing away from the cathode, a part of the beam current being influenced by the auxiliary cathode being capable of being blanked out by the aperture restrictor. The precision resistor as an actual value generator is connected to a regulator connected to a reference voltage. The output of the regulator is connected to the auxiliary electrode for the purpose of maintaining the beam current blanked out by the diaphragm constant. Depending upon the position of the aperture restrictor, it can be advantageous to place the restrictor at a potential which differs from the zero potential of the electron beam generating system. A further advantageous feature of the invention is that the diaphragm or restrictor is designed as a Faraday cage. Another advantageous feature of the invention is that the anode of the system is designed as an aperture restrictor.

BRIEF DESCRIPTION OF THE DRAWINGS

Other objects, features and advantages of the invention, its organization, construction and operation will be best understood from the following detailed description, taken in conjunction with the accompanying drawings, on which.

DESCRIPTION OF THE PREFERRED EMBODIMENTS

Figure 1:
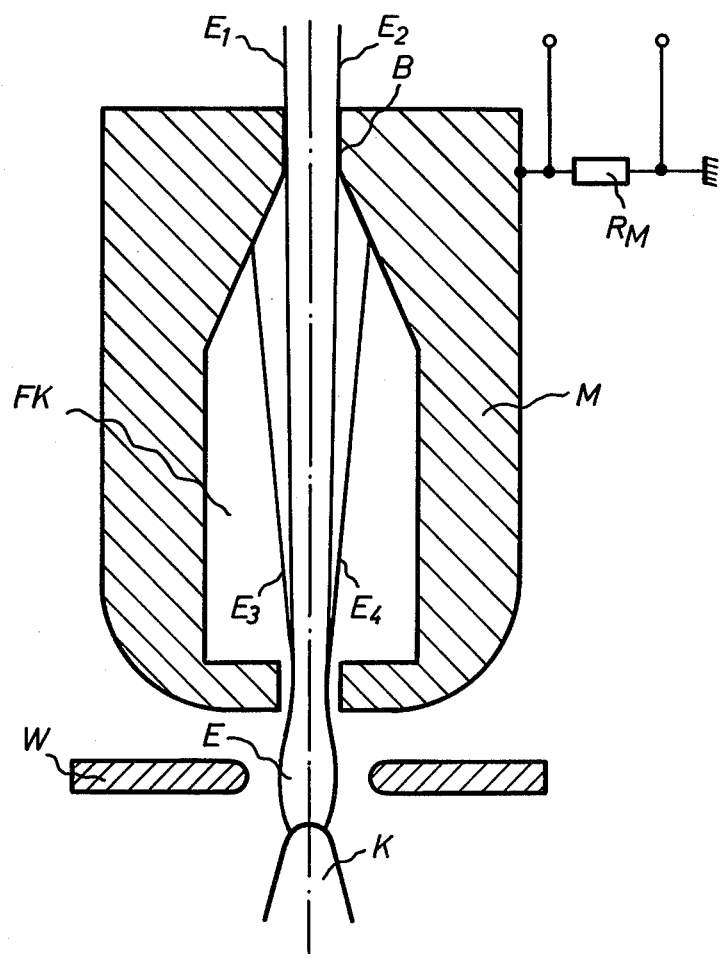
FIG. 1 is a schematic representation, shown partially in section, of the disposition of the electrodes of an electron beam generating system.

Referring to FIG. 1, a fundamental format of the beam generating system is illustrated, namely a heated cathode K, an auxiliary electrode W and a restrictor M which surrounds the electron beam E emerging from the cathode surface. The restrictor M is connected over a precision resistor $R_M$ to a constant potential, for example ground, and is designed in such a manner that the portion of the beam current which is greater than the bore B of the restrictor is intercepted. In order to maintain the efficiency of this diaphragm arrangement constant, the space in front of the diaphragm in the direction of the cathode is also constructed as a Faraday cage FK. Within the beam generating system, the restrictor M can itself be the anode or, as viewed in the beam direction, the anode can be disposed in front of or after the restrictor. When the beam is focused in such a manner that it has a size which is illustrated by the marginal rays $E_1$ and $E_2$, then it can pass the aperture B unimpeded. When the beam is more greatly fanned, as illustrated by the marginal rays $E_3$ and $E_4$, then it impinges on the inside wall of the restrictor M and a current flows through the precision resistor $R_M$ to the reference potential.

It can thereby be advantageous when the restrictor M is connected to a potential which differs from the zero potential of the electron beam generating system.

Practice has shown that the spacing between the cathode and the anode changes due to thermal drifts, particularly in the start-up phase. Given a permanently set voltage at the auxiliary electrode W, also called the Wehnelt cylinder, the beam geometry thereby changes and, without the restrictor M and the control of the present invention, a change of the beam intensity arises.

Figure 2:
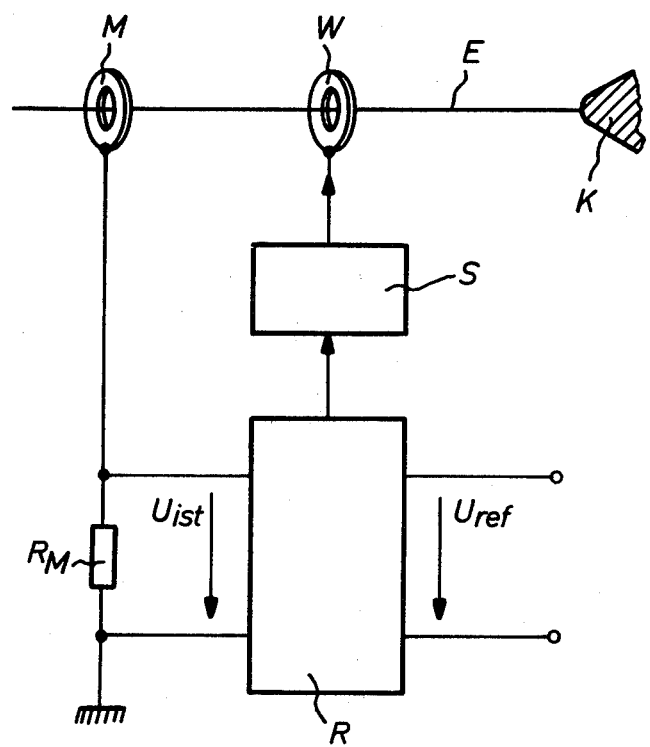
FIG. 2 is a schematic exemplary circuit diagram of a circuit for practicing the invention.

A circuit arrangement is illustrated in FIG. 2 in which the leakage current occurring at the precision resistor $R_M$ which produces a voltage drop $U_{ist}$ at the precision resistor $R_M$ is forwarded to a voltage regulator R which is, in turn, again connected to a reference potential $U_{ref}$. The output of the regulator is, in turn, connected to a final control element S which emits a control voltage to the auxiliary electrode W, the control voltage causing the voltage occurring at the precision resistor $R_M$ to be kept constant.

The results attained therewith can be further improved when an electron beam generator according to the aforementioned patent application PCT/DE/80/00086 is employed given which measures are undertaken by way of a control of the cathode temperature and dimensioning of the active cathode surfaces so that the total emission current is constant. When these two measures are combined, then a beam generator is provided which exhibits the required high-steadiness.

The present invention can advantageously be employed in material processing with electron beams where it is a matter of high steadiness of the electron beam which is required. A particular area of application lies in the field of producing printing forms by way of electron beams, whereby the electron beam engraves the cups required for the printing operation in the surface of the printing form. Moreover, the invention can also be employed in electron beam microscopy and in electron beam lithography for manufacturing high-precision semiconductor components.

Although we have described our invention by reference to particular illustrative embodiments thereof, many changes and modifications of the invention may become apparent to those skilled in the art without departing from the spirit and scope of the invention. We therefore intend to include within the patent warranted hereon all such changes and modifications as may reasonably and properly be included within the scope of our contribution to the art.

We claim:

1. In an electron beam generating system which comprises a heated cathode for generating an electron beam an auxiliary electrode and a transpierced anode, the improvement comprising:
   a diaphragm structure surrounding the electron beam at the side of the auxiliary electrode which is opposite to the cathode; a precision resistor connected to said diaphragm structure for developing a voltage drop in response to a portion of the electron beam striking said diaphragm structure,
   a voltage regulator connected to a reference voltage and connected to said precision resistor for developing a control voltage; and
   a control element connected between said voltage regulator and the auxiliary electrode for applying a control potential to the auxiliary electrode in response to the control voltage as a correction measure of that portion of the electron beam striking said diaphragm structure.

2. The improved electron beam generating system of claim 1, wherein said diaphragm structure comprises a Faraday cage.

3. The improved electron beam generating system of claim 1, wherein said diaphragm structure is connected to a potential which differs from the zero potential of the beam generating system.

4. The improved electron beam generating system of claim 1, wherein said diaphragm structure comprises the anode.

5. The improved electron beam generating system of claim 1, and further comprising cathode heating control means connected to said cathode, and wherein the cathode comprises an active surface dimensioned and constructed to determine beam current in response to said cathode heating control means.

* * * * *